US011796847B2

(12) United States Patent
Xu et al.

(10) Patent No.: US 11,796,847 B2
(45) Date of Patent: Oct. 24, 2023

(54) ARRAY SUBSTRATE COMPRISING A FIRST METAL LAYER ELECTRICALLY CONNECTED TO A FIRST DOPED AREA THROUGH A BRIDGE LAYER AND DISPLAY PANEL

(71) Applicant: WUHAN CHINA STAR OPTOELECTRONICS TECHNOLOGY CO., LTD., Hubei (CN)

(72) Inventors: Yong Xu, Hubei (CN); Fei Ai, Hubei (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 0 days.

(21) Appl. No.: 17/600,321

(22) PCT Filed: Aug. 19, 2021

(86) PCT No.: PCT/CN2021/113410
§ 371 (c)(1),
(2) Date: Sep. 30, 2021

(87) PCT Pub. No.: WO2023/000422
PCT Pub. Date: Jan. 26, 2023

(65) Prior Publication Data
US 2023/0028565 A1 Jan. 26, 2023

(30) Foreign Application Priority Data
Jul. 22, 2021 (CN) .......................... 202110828079.7

(51) Int. Cl.
G02F 1/1333 (2006.01)
G02F 1/1362 (2006.01)
(Continued)

(52) U.S. Cl.
CPC .. *G02F 1/133345* (2013.01); *G02F 1/133357* (2021.01); *G02F 1/134309* (2013.01);
(Continued)

(58) Field of Classification Search
CPC ........... G02F 1/133357; G02F 2201/07; G02F 2202/104; G02F 1/13625; G02F 2202/103;
(Continued)

(56) References Cited

U.S. PATENT DOCUMENTS

2014/0002973 A1* 1/2014 Lee ...................... H05K 5/0017
361/679.01
2015/0009436 A1* 1/2015 Kim ..................... G02F 1/13476
349/86
(Continued)

FOREIGN PATENT DOCUMENTS

CN 109742158 A 5/2019
CN 110071147 A 7/2019
(Continued)

OTHER PUBLICATIONS

Chinese Office Action issued in corresponding Chinese Patent Application No. 202110828079.7 dated May 28,2023, pp. 1-6.
(Continued)

*Primary Examiner* — Paul C Lee
(74) *Attorney, Agent, or Firm* — PV IP PC; Zhigang Ma; Wei Te Chung

(57) ABSTRACT

An array substrate, includes: a substrate, a first metal layer, a first buffer layer, and an active layer, a gate insulating layer, a second metal layer, a first insulating layer, a third metal layer and a first planarization layer. The first metal layer is electrically connected with the first doped area of the active layer through the bridge layer of the second metal layer. The third metal layer is electrically connected with the
(Continued)

second doped area of the active layer. The array substrate of the present disclosure reduces a size of a thin film transistor by stacking the first metal layer, the second metal layer, and the third metal layer, thereby increasing pixel density. A display panel is also provided.

20 Claims, 4 Drawing Sheets

(51) Int. Cl.
  *G02F 1/1343* (2006.01)
  *H01L 27/12* (2006.01)
  *H01L 29/786* (2006.01)
  *H01L 29/66* (2006.01)
(52) U.S. Cl.
  CPC .... *G02F 1/136204* (2013.01); *H01L 27/1222* (2013.01); *H01L 27/1274* (2013.01); *H01L 29/66757* (2013.01); *H01L 29/78675* (2013.01); *G02F 2201/07* (2013.01)
(58) Field of Classification Search
  CPC ........... G02F 2202/105; G02F 1/16755; H01L 27/1274
  See application file for complete search history.

(56) References Cited

U.S. PATENT DOCUMENTS

| 2019/0004641 | A1* | 1/2019 | Huang | ............. G02F 1/133514 |
| 2019/0074304 | A1 | 3/2019 | Lee | |

FOREIGN PATENT DOCUMENTS

| CN | 110164923 | A | * | 8/2019 | ......... H01L 27/1251 |
| CN | 110164923 | A | | 8/2019 | |
| CN | 110649046 | A | | 1/2020 | |
| CN | 112038325 | A | | 12/2020 | |
| CN | 112420784 | A | | 2/2021 | |
| CN | 113097266 | A | * | 7/2021 | |
| CN | 113097266 | A | | 7/2021 | |

OTHER PUBLICATIONS

International Search Report in International application No. PCT/CN2021/113410, dated Apr. 22, 2022.
Written Opinion of the International Search Authority in International application No. PCT/CN2021/113410, dated Apr. 22, 2022.

* cited by examiner

1000

ARRAY SUBSTRATE COMPRISING A FIRST METAL LAYER ELECTRICALLY CONNECTED TO A FIRST DOPED AREA THROUGH A BRIDGE LAYER AND DISPLAY PANEL

TECHNICAL FIELD

The present disclosure claims the priority of a Chinese patent application filed with the Chinese patent office on Jul. 22, 2021, the application number is 202110828079.7, and the invention title is "array substrate and display panel", the entire content of which is incorporated into the present disclosure by reference.

The present disclosure relates to a field of display technology, and more particularly to an array substrate and a display panel.

BACKGROUND

Liquid crystal displays (LCD) are widely used in various consumer electronic products such as mobile phones, televisions, personal digital assistants, digital cameras, notebook computers, desktop computers, and have become mainstream of display panels, due to their advantages of high image quality, power saving, thin body and a wide range of applications, etc. Especially low temperature polysilicon (LTPS) display technology, because of its high carrier mobility, a transistor can obtain a higher switching current ratio, under condition of meeting required charging current, each transistor can be smaller in size, increase a light transmission area of each pixel, increase an aperture ratio of a panel, improve brightness and high resolution of the panel, and reduce power consumption of the panel, so as to obtain a better visual experience.

However, polysilicon manufacturing process is complex and requires high manufacturing precision. Miniaturization of transistors is limited by manufacturing precision, and further improvement of pixel density is limited.

The polysilicon manufacturing process is complex and requires high manufacturing precision. Miniaturization of transistors is limited by manufacturing precision, and further improvement of pixel per inch (PPI) is limited.

SUMMARY

A purpose of the present disclosure is to provide an array substrate and a display panel to solve a technical problem that the improvement of pixel density in the prior art is limited.

In order to solve above-mentioned problem, the present disclosure provides an array substrate, including: a substrate; a first metal layer, wherein the first metal layer is disposed on the substrate; a first buffer layer, wherein the first buffer layer is disposed on the first metal layer; an active layer, wherein the active layer is disposed on the first buffer layer, the active layer is provided with a channel area, a first doped area and a second doped area; and the channel area is connected between the first doped area and the second doped area; a gate insulating layer, wherein the gate insulating layer is disposed on the active layer; a second metal layer, wherein the second metal layer is disposed on the gate insulating layer, and the second metal layer includes a bridge layer and a gate electrode disposed at intervals; a first insulating layer, wherein the first insulating layer is disposed on the second metal layer; and a third metal layer, wherein the third metal layer is disposed on the first insulating layer.

Wherein the first metal layer is electrically connected with the first doped area through the bridge layer, and the third metal layer is electrically connected with the second doped area.

In some embodiments, an orthographic projection of the gate electrode on the substrate at least partially is within an orthographic projection range of the first metal layer on the substrate and an orthographic projection range of the third metal layer on the substrate.

In some embodiments, the substrate further includes: a first planarization layer disposed on the third metal layer, wherein a first opening configured to expose the third metal layer is defined on the first planarization layer; and a filling layer, which is disposed on the first planarization layer, and the first opening is filled with the filling layer.

Wherein a height difference between a top of part corresponding to the first opening and a top of other parts in the filling layer is smaller than a depth of the first opening.

In some embodiments, the filling layer includes: a first electrode layer, wherein the first electrode layer is disposed on the first planarization layer, and the first electrode layer is electrically connected with the third metal layer through the first opening; a second insulating layer, wherein the second insulating layer is disposed on the first electrode layer; a second electrode layer, wherein the second electrode layer is disposed on the second insulating layer, and a second opening corresponding to the first opening is defined on the second electrode layer; and a second planarization layer, wherein the second planarization layer is disposed on the second electrode layer and located in the second opening.

In some embodiments, the bridge layer is electrically connected with the first metal layer through a first through hole penetrating the gate insulating layer and the first buffer layer, and the bridge layer is electrically connected with the first doped area through a second through hole penetrating the gate insulating layer; and the third metal layer is electrically connected with the second doped area through a third through hole penetrating the first insulating layer and the gate insulating layer.

In some embodiments, the array substrate further includes: a metal shielding layer, wherein the metal shielding layer is disposed between the first buffer layer and the active layer; and a second buffer layer, wherein the second buffer layer is disposed between the active layer and the metal shielding layer, and the metal shielding layer and the first buffer layer is covered by the second buffer layer.

In some embodiments, an orthographic projection of the channel area on the substrate is within an orthographic projection range of the metal shielding layer on the substrate.

In some embodiments, an orthographic projection of the gate electrode on the substrate is coincident with an orthographic projection of the channel area on the substrate, and an orthographic projection of the third metal layer on the substrate is within the orthographic projection range of the first metal layer on the substrate.

The present disclosure provides a display panel, including an array substrate, a color filter substrate and a liquid crystal layer disposed between the array substrate and the color filter substrate; wherein the array substrate is any one of above-mentioned array substrates.

In the array substrate and the display panel of the present disclosure, the first metal layer is electrically connected with the first doped area through the bridge layer, which can save space occupied by data lines in a conventional structure, reduce sub-pixel size, and increase pixel density. In addition, the first metal layer, the second metal layer, and the third metal layer are stacked, namely, by stacking a source electrode, a gate electrode, and a drain electrode, a size of a thin film transistor can be further reduced, a pixel density can be increased, and product competitiveness can be improved.

Moreover, by providing the first planarization layer, unevenness caused by the stacked arrangement of the first metal layer, the second metal layer, and the third metal layer can be alleviated, thereby reducing a problem of liquid crystal light leakage.

DESCRIPTION OF DRAWINGS

In order to more clearly illustrate the technical solutions in the embodiments of the present disclosure, the following will briefly introduce the drawings that need to be used in the description of the embodiments. Obviously, the drawings in the following description are only some embodiments of the present disclosure. For those skilled in the art, without creative work, other drawings can be obtained based on these drawings.

DETAILED DESCRIPTION OF PREFERRED EMBODIMENTS

Figure 1:
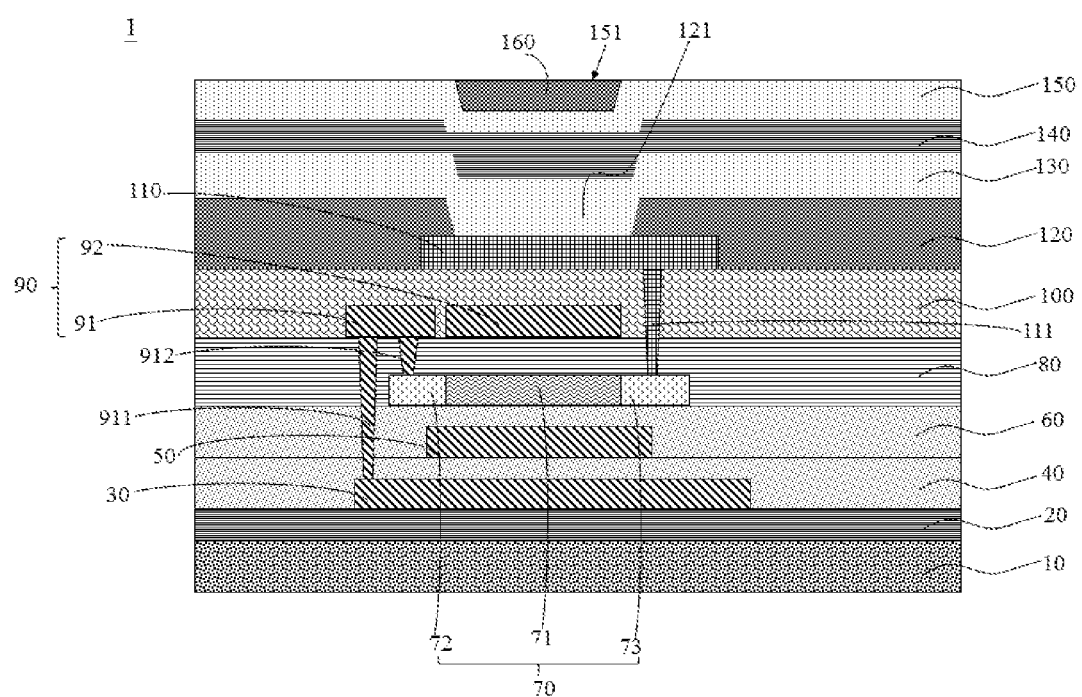
FIG. 1 is a schematic diagram of a structure of an array substrate In one embodiment of the present disclosure.
Figure 2:
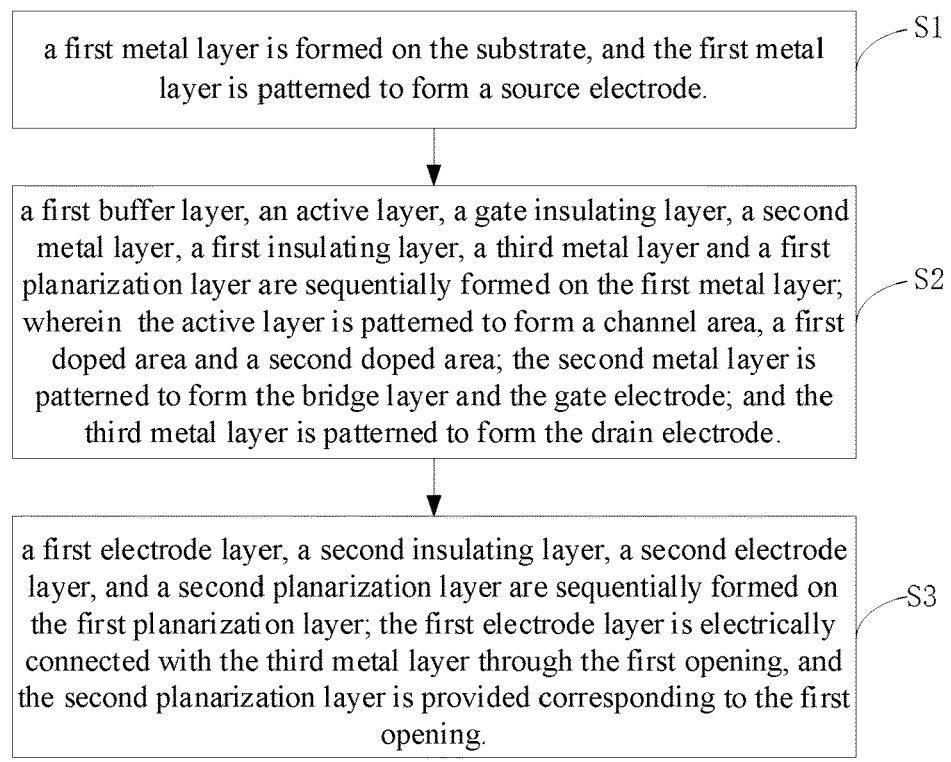
FIG. 2 is a flowchart of a method for preparing the array substrate In one embodiment of the present disclosure.

The following will be combined with drawings in the embodiments of the present disclosure, a clear and complete description of the technical solutions in the embodiments of the present disclosure. Obviously, the described embodiments are only a part of the embodiments of the present disclosure, rather than all the embodiments. Based on the embodiments in the present disclosure, all other embodiments obtained by those skilled in the art without creative work shall fall within the protection scope of the present disclosure.

In descriptions of the present disclosure, it should be noted that, the terms "center", "vertical", "horizontal", "length", "width", "thickness", "upper", "lower", "front", "rear", "left", "Right", "vertical", "horizontal", "top", "bottom", "inner", "outer", "clockwise", "counterclockwise", and other indicated directions or the position relation are based on the orientation or position relation shown in the figures. Only for convenience of describing the present disclosure and the simplification of the description, rather than indicating or implying that the means or elements referred to have a specific orientation, so that the above directions of the present disclosure cannot be understood as limitations. In addition, the terms "first" and "second" are used only for purposes of description, and cannot be understood to indicate or imply a relative importance or to implicitly indicate the number of technical features indicated. Thus, the features "first" and "second" can be expressly or implicitly included in one or more of the features. In the description of the present disclosure, the meanings of "multiple" are two or more, unless specifically limited otherwise.

In the description of the present disclosure, it should be noted that, unless otherwise clearly defined and limited, the terms "installation", "connected", and "connected" should be interpreted broadly. For example, the connection can be fixedly connected, detachably connected, or integrally connected, and can be mechanically connected, electrically connected, or can be in communication with each other. The connection can be directly connected or indirectly connected through an intermediate medium, and can be internal connection of two elements or an interaction relationship between the two elements. For those of ordinary skill in the art, the specific meanings of the above-mentioned terms in the present disclosure can be understood according to specific circumstances.

The following descriptions provide many different embodiments or examples for implementing different structures of the present disclosure. In order to simplify the descriptions of the present disclosure, components and arrangements of specific examples are described below. They are merely examples and are not intended to limit the present disclosure. In addition, reference numerals and reference letters can be repeated in different examples, and such repetition is for the purpose of simplicity and clarity, and is not intended to indicate the relationship between the various embodiments and/or arrangements discussed. In addition, the disclosure provides examples of various specific processes and materials, but one of ordinary skill in the art can realize other processes and the use of other materials.

Technical solution of the present disclosure will be described in conjunction with specific embodiments.

Referring to FIG. 1, the present disclosure provides an array substrate 1, it includes a plurality of thin film transistors. Each of the plurality of thin film transistors includes: a substrate 10, a first metal layer 30 disposed on the substrate 10, a first buffer layer 40 disposed on the first metal layer 30, an active layer 70 disposed on the first buffer layer 40, a gate insulating layer 80 disposed on the active layer 70, a second metal layer 90 disposed on the gate insulating layer 80, a first insulating layer 100 disposed on the second metal layer 90, and a third metal layer 110 disposed on the first insulating layer 100.

Wherein, the active layer 70 is provided with a channel area 71, a first doped area 72 and a second doped area 73; and the channel area 71 is connected between the first doped area 72 and the second doped area 73. The second metal layer 90 includes a bridge layer 91 and a gate electrode 92 disposed at intervals. The first metal layer 30 is electrically connected with the first doped area 72 through the bridge layer 91, and the third metal layer 110 is electrically connected with the second doped area 73.

Specifically, the first metal layer 30 includes a source electrode. In this embodiment, the first metal layer 30 shown in FIG. 1 is a patterned source electrode, so a reference number of the source electrode may be same as the first metal layer. The third metal layer 110 includes a drain electrode. In this embodiment, the third metal layer 110 shown in FIG. 1 is a patterned drain electrode, so a reference number of the drain electrode may be same as the third metal layer.

Wherein, for the active layer 70, an amorphous silicon layer is first produced, and the amorphous silicon layer is annealed to form a polysilicon layer. Then ion doping is performed at positions corresponding to the first doped area 72 and the second doped area 73 to conduct the formation of the first doped area 72 and the second doped area 73, and the channel area 71 is formed in the middle. Doping ions may be phosphorus ions or boron ions, and the present disclosure is not limited to this.

The array substrate of the present disclosure is formed by stacking the first metal layer 30, the second metal layer 90, and the third metal layer 110. Namely, the source electrode 30, the gate electrode 92, and the drain electrode 110 are layered, so that a size of the a thin film transistor can be reduced, pixel density can be increased, and product competitiveness can be improved.

It is understandable that, in the array substrate 1 of the present disclosure, the source electrode 30, the gate electrode 92, and the drain electrode 110 of the thin film transistor are stacked, so that the source electrode 30, the gate electrode 92 and the drain electrode 110 have overlapping areas. It can reduce the size of the thin film transistor, and increase the pixel density.

Furthermore, the materials of the first buffer layer 40, the gate insulating layer 80 and the first insulating layer 100 include inorganic materials, such as silicon nitride, silicon oxide, or the like, but the present disclosure is not limited to this.

Furthermore, the array substrate 1 further includes a first planarization layer 120 disposed on the third metal layer 110. A material of the first planarization layer 120 includes an organic polymer, preferably the organic polymer with excellent leveling properties, such as polyacrylate or polyimide, but the present disclosure is not limited to this.

Therefore, in the array substrate 1 of the present disclosure, by providing the first planarization layer 120, unevenness caused by lamination of the first metal layer 30, the second metal layer 90 and the third metal layer 110 is alleviated, thereby reducing the problem of liquid crystal light leakage.

Specifically, the first metal layer 30, the second metal layer 90, and the third metal layer 110 are stacked. As a result, this stacked structure has a higher level than inorganic layers with only the first buffer layer 40, the gate insulating layer 80, and the first insulating layer 100 on both sides of the stacked structure, resulting in uneven surface. Therefore, the liquid crystal in the liquid crystal layer 2 disposed above the array substrate 1 is affected by the uneven surface, and will still be deflected when there is no electric field, causing light leakage. In the array substrate 1 of the present disclosure, by providing the first planarization layer 120 disposed on the third metal layer 110, the unevenness caused by lamination of the first metal layer 30, the second metal layer 90 and the third metal layer 110 is alleviated, thereby reducing the problem of liquid crystal light leakage.

In one embodiment of the present disclosure, an orthographic projection of the gate electrode 92 on the substrate 10 is within an orthographic projection range of the first metal layer 30 on the substrate 10 and an orthographic projection range of the third metal layer 110 on the substrate 10.

Preferably, the orthographic projection of the gate electrode 92 on the substrate 10 is coincident with an orthographic projection of the channel area 71 on the substrate 10, and the orthographic projection of the third metal layer 110 on the substrate 10 is within the orthographic projection range of the first metal layer 30 on the substrate 10.

It can be understood that maximizing an overlapping area of the source electrode 30, the gate electrode 92 and the drain electrode 110 can further reduce the size of the thin film transistor, thereby further increasing the pixel density.

In one embodiment of the present disclosure, the array substrate 1 further includes a metal shielding layer 50 and a second buffer layer 60. The metal shielding layer is disposed between the first buffer layer and the active layer. The metal shielding layer and the first buffer layer is covered by the second buffer layer.

A material of the second buffer layer 60 includes inorganic materials, such as silicon nitride, silicon oxide, or the like, but the present disclosure is not limited to this.

The metal shielding layer 50 is configured to shield the first metal layer 30 to prevent the voltage of the first metal layer 30 from affecting the channel area 71 of the active layer 70 and causing the thin film transistor to fail.

It should be noted that an orthographic projection of the channel area 71 on the substrate 10 is within an orthographic projection range of the metal shielding layer 50 on the substrate 10. Namely, left and right sides of the metal shielding layer 50 are at least flush with the two sides of the channel area 71, and the left and right sides of the metal shielding layer 50 are also corresponding to the first doped area 72 and the second doped area 73, thereby effectively preventing a voltage of the first metal layer 30 from affecting the channel area 71 of the active layer 70 and causing the thin film transistor to fail.

In one embodiment of the present disclosure, materials of the first metal layer 30, the metal shielding layer 50, and the second metal layer 90 include high temperature resistant metal materials, such as Mo, Ti, Al or its alloys, but the present disclosure is not limited to this. Materials of the third metal layer 110 may be Ti/Al/Ti, Mo/Al/Mo, or the like.

In one embodiment of the present disclosure, the bridge layer 91 is electrically connected with the first metal layer 30 through a first through hole 911 penetrating the gate insulating layer 80, the second 60 buffer layer, and the first buffer layer 40, and the bridge layer is electrically connected with the first doped area 72 through a second through hole 912 penetrating the gate insulating layer 80. The third metal layer 110 is electrically connected with the second doped area 73 through a third through hole 111 penetrating the first insulating layer 100 and the gate insulating layer 80.

Preferably, an orthographic projections of the first through hole 911, the second through hole 912, and the third through hole 111 on the substrate 10 are within an orthographic projection range of the first metal layer 30 on the substrate 10. Moreover, an orthographic projection of the bridge layer 91 on the substrate 10 is also within the orthographic projection of the first metal layer 30 on the substrate 10.

It can be understood that by maximizing an overlapping area of the source electrode 30 and the bridge layer 91, the size of the thin film transistor can be further reduced, thereby further increasing the pixel density.

Furthermore, a first opening 121 configured to expose the third metal layer 110 is defined on the first planarization layer 120. The substrate further includes a filling layer (130, 140, 150, 160), the filling layer is disposed on the first planarization layer 120, and the first opening 121 is filled with the filling layer.

Wherein a height difference between a top of part corresponding to the first opening 121 and a top of other parts in the filling layer is smaller than a depth of the first opening 121.

Furthermore, the filling layer includes: a first electrode layer 130, wherein the first electrode layer 130 is disposed on the first planarization layer 120, and the first electrode layer 130 is electrically connected with the third metal layer 110 through the first opening 121; a second insulating layer 140, wherein the second insulating layer 140 is disposed on the first electrode layer 130; a second electrode layer 150, wherein the second electrode layer 150 is disposed on the second insulating layer 140, and a second opening 151 corresponding to the first opening 121 is defined on the second electrode layer 150; and a second planarization layer 160, wherein the second planarization layer 160 is disposed on the second electrode layer 150 and located in the second opening 151.

Wherein, the material of the first electrode layer 130 and the second electrode layer 150 may be indium tin oxide (ITO). The material of the second insulating layer 140 includes inorganic materials, such as silicon nitride, silicon oxide, and the like. The material of the second planarization layer 160 includes an organic polymer, preferably an organic polymer with excellent leveling properties, such as polyacrylate or polyimide, but the present disclosure is not limited to this.

Specifically, the first electrode layer 130 is electrically connected with the third metal layer 110 through the first opening 121 to achieve electrical connection with the thin film transistor, then to drive deflection of liquid crystal in the liquid crystal layer 2 to achieve display.

However, since the first opening 121 is provided in the first planarization layer 120, after the deposition of the second electrode layer 150, at a position corresponding to the first opening 121, its surface has a lower level than the two sides of the first opening 121, resulting in uneven surface. Therefore, the liquid crystal in the liquid crystal layer 2 disposed above the second electrode layer 150 is affected by the uneven surface, and will still be deflected when there is no electric field, causing light leakage. In the array substrate 1 of the present disclosure, by providing the second planarization layer 160 on the second electrode layer 150, the unevenness caused by the first opening 121 can be alleviated, and the problem of liquid crystal light leakage can be reduced.

In one embodiment of the present disclosure, the array substrate 1 may further include a third insulating layer 20. The third insulating layer 20 is disposed between the substrate 10 and the first metal layer 30 to prevent external water and oxygen from intruding through the gap between the substrate 10 and the first metal layer 30 and causing the array substrate 1 to fail.

Please refer to FIG. 1 to FIG. 5, the present disclosure further provides a method for manufacturing the array substrate 1. The array substrate 1 includes a plurality of thin film transistors. For simplicity, the drawings in the present disclosure only show one thin film transistor.

Figure 3:
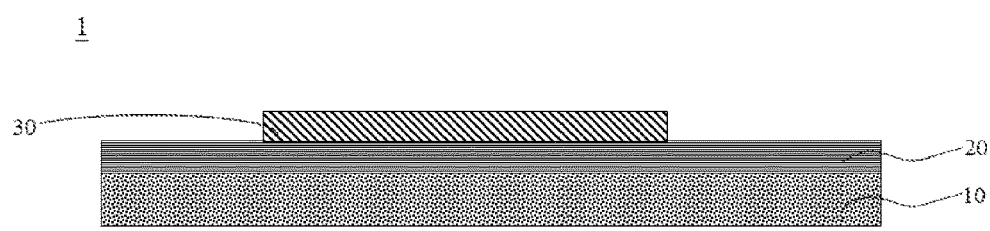
FIGS. 3 to 5 are schematic diagrams of the structure of each step in a manufacturing method of the array substrate in the embodiment of the present disclosure.

The method includes the following steps:

S1: a first metal layer 30 is formed on the substrate 10, and the first metal layer 30 is patterned to form a source electrode 30. Referring to FIG. 3, the first metal layer 30 is the patterned source electrode 30, so a reference number of the source electrode may be the same as the first metal layer.

Wherein, before the first metal layer 30 is formed, the method may further include forming a third insulating layer 20 on the substrate 10. The third insulating layer 20 is disposed between the substrate 10 and the first metal layer 30 to further prevent external water and oxygen from intruding from the gap between the substrate 10 and the first metal layer 30 to cause the array substrate 1 to fail.

S2: a first buffer layer 40, an active layer 70, a gate insulating layer 80, a second metal layer 90, a first insulating layer 100, a third metal layer 110 and a first planarization layer 120 are sequentially formed on the first metal layer 30.

Figure 4:
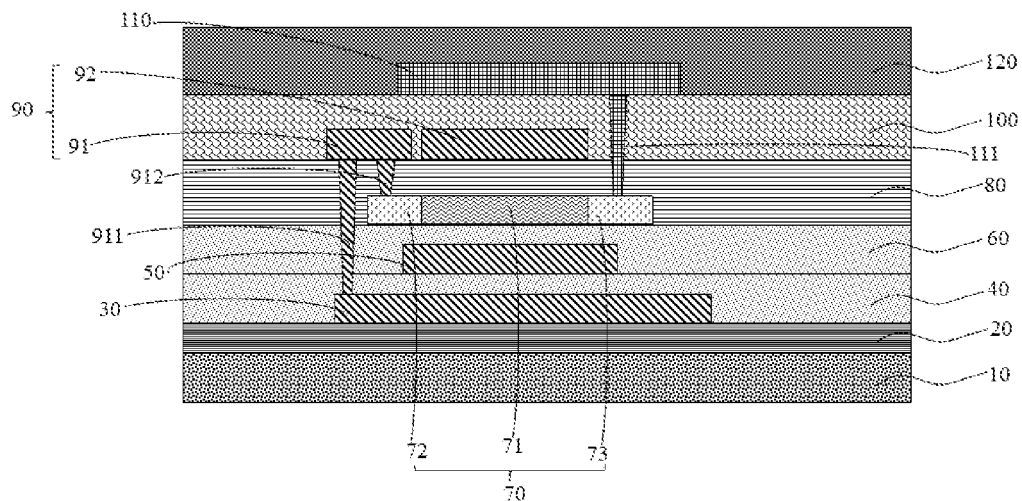

Wherein, the active layer 70 is patterned to form a channel area 71, a first doped area 72 and a second doped area 73. The second metal layer 90 is patterned to form the bridge layer 91 and the gate electrode 92. The third metal layer 110 is patterned to form the drain electrode 110. Referring to FIG. 4, the third metal layer 110 is the patterned drain electrode 110, so the reference number of the drain electrode may be the same as that of the third metal layer.

The first metal layer 30 is electrically connected with the first doped area 72 through the bridge layer 91, and the third metal layer 110 is electrically connected with the second doped area 73.

In one embodiment of the preparation method of the present disclosure, For the active layer 70, an amorphous silicon layer is first produced, and the amorphous silicon layer is annealed to form a polysilicon layer, then ion doping is performed at positions corresponding to the first doped area 72 and the second doped area 73 to conduct the formation of the first doped area 72 and the second doped area 73. The channel area 71 is formed in the middle. The doping ions may be phosphorus ions or boron ions. In other embodiments, a preparation method of the active layer 70 may also be other well-known methods in the art, which is not specifically limited herein.

The preparation method of array substrate of the present disclosure, the first metal layer 30, the second metal layer 90, and the third metal layer 110 are stacked. Namely, the source electrode 30, the gate electrode 92, and the drain electrode 110 are layered, so that a size of the a thin film transistor can be reduced, pixel density can be increased, and product competitiveness can be improved.

Furthermore, the materials of the first buffer layer 40, the gate insulating layer 80 and the first insulating layer 100 include inorganic materials, such as silicon nitride, silicon oxide, or the like, but the present disclosure is not limited to this. The material of the first planarization layer 120 includes an organic polymer, preferably an organic polymer with excellent leveling properties, such as polyacrylate or polyimide, but the present disclosure is not limited to this.

Therefore, in the preparation method of the array substrate of the present disclosure, the first planarization layer 120 is disposed on the third metal layer 110, which can relieve the unevenness caused by the lamination of the first metal layer 30, the second metal layer 90 and the third metal layer 110, thereby reducing the problem of liquid crystal light leakage.

In the manufacturing method of the array substrate of the present disclosure, an orthographic projection of the gate 92 on the substrate 10 is within an orthographic projection range of the first metal layer 30 on the substrate 10 and an orthographic projection of the third metal layer 110 on the substrate 10.

Preferably, an orthographic projection of the gate electrode 92 on the substrate 10 is coincident with an orthographic projection of the channel area 71 on the substrate 10, and an orthographic projection of the third metal layer 110 on the substrate 10 is within the orthographic projection range of the first metal layer 30 on the substrate 10.

It can be understood that the manufacturing method of the array substrate of the present disclosure can further reduce the size of the thin film transistor by maximizing the area of the source electrode 30, the gate electrode 92 and the drain electrode 110, thereby further increasing the pixel density.

In one embodiment of the present disclosure, before the active layer 70 is formed, the method further includes forming a metal shielding layer 50 on the first buffer layer 40 and covering the second buffer layer 60 on the metal shielding layer 50.

The material of the second buffer layer 60 includes inorganic materials, such as silicon nitride, silicon oxide, or the like, but the present disclosure is not limited to this.

The metal shielding layer 50 is configured to shield the first metal layer 30 to prevent the voltage of the first metal layer 30 from affecting the channel area 71 of the active layer 70 and causing the thin film transistor to fail.

It should be noted that an orthographic projection of the channel area 71 on the substrate 10 is within an orthographic projection range of the metal shielding layer 50 on the substrate 10. Namely, left and right sides of the metal shielding layer 50 are at least flush with the two sides of the channel area 71, and left and right sides of the metal shielding layer 50 is also corresponding to the first doped area 72 and the second doped area 73, thereby effectively preventing a voltage of the first metal layer 30 from affecting the channel area 71 of the active layer 70 and causing the thin film transistor to fail.

In one embodiment of the present disclosure, materials of the first metal layer 30, the metal shielding layer 50, and the second metal layer 90 include high temperature resistant metal materials, such as Mo, Ti, Al or its alloys, but the present disclosure is not limited to this. Material of the third metal layer 110 may be Ti/Al/Ti, Mo/Al/Mo, or the like.

In one embodiment of the present disclosure, after forming the gate insulating layer 80, the method further includes opening a first through hole 911 on the gate insulating layer 80, so that the first through hole 911 penetrates the gate insulating layer 80, the second buffer layer 60 and the first buffer layer 40 to the first metal layer 30. A second through hole 912 is opened on the gate insulating layer 80 so that the second through hole 912 penetrates the gate insulating layer 80 to the first doped area 72. The bridge layer 91 is electrically connected with the first metal layer 30 through the first through hole 911 and electrically connected with the first doped area 72 through the second through hole 912.

In one embodiment of the present disclosure, after forming the first insulating layer 100, the method further includes opening a third through hole 111 on the first insulating layer 100, so that the third through hole 111 penetrates the first insulating layer 100 and the gate insulating layer 80 to the second doped area 73. The third metal layer 110 is electrically connected with the second doped area 73 through the third through hole 111.

Preferably, an orthographic projections of the first through hole 911, the second through hole 912, and the third through hole 111 on the substrate 10 are within an orthographic projection range of the first metal layer 30 on the substrate 10. Moreover, an orthographic projection of the bridge layer 91 on the substrate 10 is also within the orthographic projection of the first metal layer 30 on the substrate 10.

It can be understood that by maximizing an overlapping area of the source electrode 30 and the bridge layer 91, the size of the thin film transistor can be further reduced, thereby further increasing the pixel density.

Figure 5:
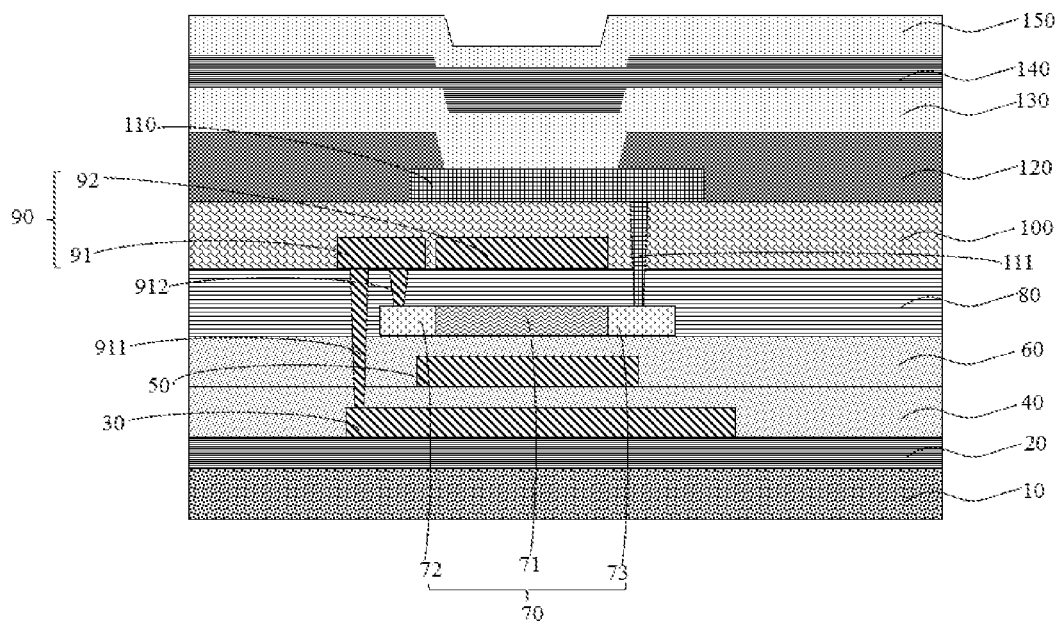

Further, referring to FIG. 5 and FIG. 1, the manufacturing method of the array substrate of the present disclosure further includes the following steps:

S3: a first electrode layer 130, a second insulating layer 140, a second electrode layer 150, and a second planarization layer 160 are sequentially formed on the first planarization layer 120.

Wherein, before forming the first electrode layer 130, the method further includes opening the first planarization layer 120 with a first opening 121 to expose a part of the third metal layer 110. The first electrode layer 130 is electrically connected with the third metal layer 110 through the first opening 121, and the second planarization layer 160 is provided corresponding to the first opening 121.

Wherein, the material of the first electrode layer 130 and the second electrode layer 150 may be indium tin oxide (ITO). The material of the second insulating layer 140 includes inorganic materials, such as silicon nitride, silicon oxide, etc. The material of the second planarization layer 160 includes an organic polymer, preferably an organic polymer with excellent leveling properties, such as polyacrylate or polyimide, but the present disclosure is not limited to this.

Specifically, the first electrode layer 130 is electrically connected with the third metal layer 110 through the first opening 121 to achieve electrical connection with the thin film transistor, then to drive deflection of liquid crystal in the liquid crystal layer 2 to achieve display.

However, since the first opening 121 is provided in the first planarization layer 120, after the deposition of the second electrode layer 150, at a position corresponding to the first opening 121, its surface has a lower level than the two sides of the first opening 121, resulting in uneven surface. Therefore, the liquid crystal in the liquid crystal layer 2 disposed above the second electrode layer 150 is affected by the uneven surface, and will still be deflected when there is no electric field, causing light leakage. In the array substrate 1 of the present disclosure, by providing the second planarization layer 160 on the second electrode layer 150, the unevenness caused by the first opening 121 can be alleviated, and the problem of liquid crystal light leakage can be reduced.

Figure 6:
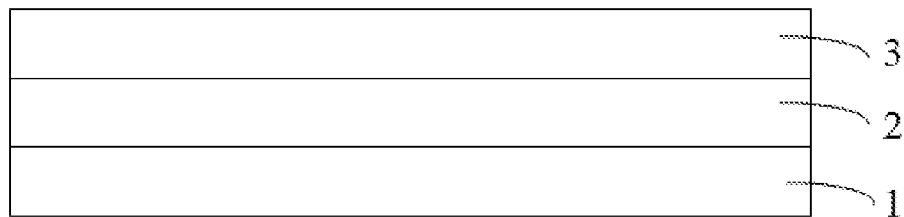
FIG. 6 is a schematic structural diagram of a liquid crystal display panel In one embodiment of the present disclosure.

Referring to FIG. 6, the present disclosure provides a display panel, including an array substrate, a color filter substrate and a liquid crystal layer disposed between the array substrate and the color filter substrate; wherein the array substrate is any one of above-mentioned array substrates. Specifically, the display panel may be a liquid crystal display panel 1000. The liquid crystal display panel 1000 includes the array substrate 1, the liquid crystal layer 2 and the color filter substrate 3 described in the above embodiments, which are sequentially stacked. The liquid crystal display panel is preferably a lateral electric field effect liquid crystal display panel, namely, an in-plane switching (IPS) mode liquid crystal display panel. Generally, the pixel density of an IPS mode liquid crystal display panel is 500 to 600 PPI, and the liquid crystal display panel 1000 of the present disclosure includes an array substrate 1 whose pixel density can be higher than 1000 PPI.

In summary, the array substrate, its preparation method, and the display panel provided by the present disclosure have the following beneficial effects:

The first metal layer 30, the second metal layer 90, and the third metal layer 110 are stacked. Namely, the source electrode 30, the gate electrode 92, and the drain electrode 110 are layered, so that a size of the a thin film transistor can be reduced, pixel density can be increased, and product competitiveness can be improved.

By providing the first planarization layer 120 on the third metal layer 110, the unevenness caused by the stacked arrangement of the first metal layer 30, the second metal layer 90, and the third metal layer 110 can be alleviated, thereby reducing the problem of liquid crystal light leakage.

Furthermore, the second planarization layer 160 is disposed on the second electrode layer 150, so as to further alleviate the unevenness caused by the first opening 121 and reduce the problem of liquid crystal light leakage.

In above-mentioned embodiments, the description of each embodiment has its own emphasis. For parts that are not described in detail In one embodiment, reference may be made to related descriptions of other embodiments.

The embodiments of the present disclosure are described in detail above, and specific examples are used in this article to illustrate the principles and implementation manners of the present disclosure. The descriptions of the above embodiments are only used to help understand the technical solutions and core ideas of the present disclosure. Those of ordinary skill in the art should understand that: they can still modify the technical solutions described in the foregoing embodiments, or equivalently replace some of the technical features, and these modifications or replacements do not cause the essence of the corresponding technical solutions to deviate from the scope of the technical solutions of the embodiments of the present disclosure.

What is claimed is:

1. An array substrate, comprising:
   a substrate;
   a first metal layer, wherein the first metal layer is disposed on the substrate;
   a first buffer layer, wherein the first buffer layer is disposed on the first metal layer;
   an active layer, wherein the active layer is disposed on the first buffer layer, the active layer is provided with a channel area, a first doped area and a second doped area; and the channel area is connected between the first doped area and the second doped area;
   a gate insulating layer, wherein the gate insulating layer is disposed on the active layer;
   a second metal layer, wherein the second metal layer is disposed on the gate insulating layer, and the second metal layer comprises a bridge layer and a gate electrode disposed at intervals, the bridge layer and the gate electrode both directly contact an upper surface of the gate insulating layer;
   a first insulating layer, wherein the first insulating layer is disposed on the second metal layer, the first insulating layer directly contacts an upper surface of the second metal layer and the gate insulating layer; and
   a third metal layer, wherein the third metal layer is disposed on the first insulating layer, the third metal layer directly contacts an upper surface of the first insulating layer;
   wherein the first metal layer is electrically connected with the first doped area through the bridge layer, and the third metal layer is electrically connected with the second doped area.

2. The array substrate of claim 1, wherein an orthographic projection of the gate electrode on the substrate at least partially is within an orthographic projection range of the first metal layer on the substrate and an orthographic projection range of the third metal layer on the substrate.

3. The array substrate of claim 1, wherein the substrate further comprises:
   a first planarization layer disposed on the third metal layer, wherein a first opening configured to expose the third metal layer is defined on the first planarization layer; and
   a filling layer, which is disposed on the first planarization layer, and the first opening is filled with the filling layer;
   wherein a height difference between a top of part corresponding to the first opening and a top of other parts in the filling layer is smaller than a depth of the first opening.

4. The array substrate of claim 3, wherein the filling layer comprises:
   a first electrode layer, wherein the first electrode layer is disposed on the first planarization layer, and the first electrode layer is electrically connected with the third metal layer through the first opening;
   a second insulating layer, wherein the second insulating layer is disposed on the first electrode layer;
   a second electrode layer, wherein the second electrode layer is disposed on the second insulating layer, and a second opening corresponding to the first opening is defined on the second electrode layer; and
   a second planarization layer, wherein the second planarization layer is disposed on the second electrode layer and located in the second opening.

5. The array substrate of claim 1, wherein the array substrate further comprises:
   a metal shielding layer, wherein the metal shielding layer is disposed between the first buffer layer and the active layer; and
   a second buffer layer, wherein the second buffer layer is disposed between the active layer and the metal shielding layer, and the metal shielding layer and the first buffer layer is covered by the second buffer layer.

6. The array substrate of claim 5, wherein an orthographic projection of the channel area on the substrate is within an orthographic projection range of the metal shielding layer on the substrate.

7. The array substrate of claim 2, wherein an orthographic projection of the gate electrode on the substrate is coincident with an orthographic projection of the channel area on the substrate, and an orthographic projection of the third metal layer on the substrate is within the orthographic projection range of the first metal layer on the substrate.

8. The array substrate of claim 1, wherein the bridge layer is electrically connected with the first metal layer through a first through hole penetrating the gate insulating layer and the first buffer layer, and the bridge layer is electrically connected with the first doped area through a second through hole penetrating the gate insulating layer; and
   the third metal layer is electrically connected with the second doped area through a third through hole penetrating the first insulating layer and the gate insulating layer.

9. The array substrate of claim 2, wherein the array substrate further comprises:
   a first planarization layer, disposed on the third metal layer, wherein a first opening configured to expose the third metal layer is defined on the first planarization layer; and
   a filling layer, which is disposed on the first planarization layer and fills the first opening;
   wherein a height difference between a top of part corresponding to the first opening and a top of other parts in the filling layer is smaller than the depth of the first opening.

10. The array substrate of claim 9, wherein the filling layer comprises:
    a first electrode layer, wherein the first electrode layer is disposed on the first planarization layer, and is electrically connected with the third metal layer through the first opening;
    a second insulating layer, wherein the second insulating layer is disposed on the first electrode layer;
    a second electrode layer, wherein the second electrode layer is disposed on the second insulating layer, and a second opening corresponding to the first opening is defined on the second electrode layer; and
    a second planarization layer, wherein the second planarization layer is disposed on the second electrode layer and located in the second opening.

11. A display panel, comprising an array substrate, a color filter substrate and a liquid crystal layer disposed between the array substrate and the color filter substrate; wherein the array substrate comprises:
- a substrate;
- a first metal layer, wherein the first metal layer is disposed on the substrate;
- a first buffer layer, wherein the first buffer layer is disposed on the first metal layer;
- an active layer, wherein the active layer is disposed on the first buffer layer, the active layer is provided with a channel area, a first doped area and a second doped area; and the channel area is connected between the first doped area and the second doped area;
- a gate insulating layer, wherein the gate insulating layer is disposed on the active layer;
- a second metal layer, wherein the second metal layer is disposed on the gate insulating layer, and the second metal layer comprises a bridge layer and a gate electrode disposed at intervals, the bridge layer and the gate electrode both directly contact an upper surface of the gate insulating layer;
- a first insulating layer, wherein the first insulating layer is disposed on the second metal layer, the first insulating layer directly contacts an upper surface of the second metal layer and the gate insulating layer; and
- a third metal layer, wherein the third metal layer is disposed on the first insulating layer, the third metal layer directly contacts an upper surface of the first insulating layer;
- wherein the first metal layer is electrically connected with the first doped area through the bridge layer, and the third metal layer is electrically connected with the second doped area.

12. The display panel of claim 11, wherein an orthographic projection of the gate electrode on the substrate at least partially is within an orthographic projection range of the first metal layer on the substrate and an orthographic projection range of the third metal layer on the substrate.

13. The display panel of claim 11, wherein the substrate further comprises:
- a first planarization layer, disposed on the third metal layer, wherein a first opening configured to expose the third metal layer is defined on the first planarization layer; and
- a filling layer, which is disposed on the first planarization layer, and the first opening is filled with the filling layer;
- wherein a height difference between a top of part corresponding to the first opening and a top of other parts in the filling layer is smaller than a depth of the first opening.

14. The display panel of claim 13, wherein the filling layer comprises:
- a first electrode layer, wherein the first electrode layer is disposed on the first planarization layer, and the first electrode layer is electrically connected with the third metal layer through the first opening;
- a second insulating layer, wherein the second insulating layer is disposed on the first electrode layer;
- a second electrode layer, wherein the second electrode layer is disposed on the second insulating layer, and a second opening corresponding to the first opening is defined on the second electrode layer; and
- a second planarization layer, wherein the second planarization layer is disposed on the second electrode layer and located in the second opening.

15. The display panel of claim 11, wherein the array substrate further comprises:
- a metal shielding layer, wherein the metal shielding layer is disposed between the first buffer layer and the active layer; and
- a second buffer layer, wherein the second buffer layer is disposed between the active layer and the metal shielding layer, and the metal shielding layer and the first buffer layer is covered by the second buffer layer.

16. The display panel of claim 15, wherein an orthographic projection of the channel area on the substrate is within an orthographic projection range of the metal shielding layer on the substrate.

17. The display panel of claim 12, wherein an orthographic projection of the gate electrode on the substrate is coincident with an orthographic projection of the channel area on the substrate, and an orthographic projection of the third metal layer on the substrate is within the orthographic projection range of the first metal layer on the substrate.

18. The display panel of claim 11, wherein the bridge layer is electrically connected with the first metal layer through a first through hole penetrating the gate insulating layer and the first buffer layer, and the bridge layer is electrically connected with the first doped area through a second through hole penetrating the gate insulating layer; and
- the third metal layer is electrically connected with the second doped area through a third through hole penetrating the first insulating layer and the gate insulating layer.

19. The display panel of claim 12, wherein the array substrate further comprises:
- a first planarization layer, disposed on the third metal layer, wherein a first opening configured to expose the third metal layer is defined on the first planarization layer; and
- a filling layer, which is disposed on the first planarization layer and fills the first opening;
- wherein a height difference between a top of part corresponding to the first opening and a top of other parts in the filling layer is smaller than the depth of the first opening.

20. The display panel of claim 19, wherein the filling layer comprises:
- a first electrode layer, wherein the first electrode layer is disposed on the first planarization layer, and is electrically connected with the third metal layer through the first opening;
- a second insulating layer, wherein the second insulating layer is disposed on the first electrode layer;
- a second electrode layer, wherein the second electrode layer is disposed on the second insulating layer, and a second opening corresponding to the first opening is defined on the second electrode layer; and
- a second planarization layer, wherein the second planarization layer is disposed on the second electrode layer and located in the second opening.

* * * * *